(12) United States Patent
Nashiki et al.

(10) Patent No.: US 9,523,147 B2
(45) Date of Patent: Dec. 20, 2016

(54) VACUUM FILM FORMATION METHOD AND LAMINATE OBTAINED BY THE METHOD

(75) Inventors: Tomotake Nashiki, Osaka (JP); Yoshimasa Sakata, Osaka (JP); Hideo Sugawara, Osaka (JP); Kenkichi Yagura, Osaka (JP); Akira Hamada, Osaka (JP); Yoshihisa Ito, Osaka (JP); Kuniaki Ishibashi, Osaka (JP)

(73) Assignee: NITTO DENKO CORPORATION, Ibaraki-Shi, Osaka (JP)

( * ) Notice: Subject to any disclaimer, the term of this patent is extended or adjusted under 35 U.S.C. 154(b) by 965 days.

(21) Appl. No.: 13/458,640

(22) Filed: Apr. 27, 2012

(65) Prior Publication Data

US 2012/0276396 A1 Nov. 1, 2012

(30) Foreign Application Priority Data

Apr. 28, 2011 (JP) ................. 2011-100509
Mar. 26, 2012 (JP) ................. 2012-068801

(51) Int. Cl.
 *C23C 14/56* (2006.01)
 *C23C 14/08* (2006.01)
 (Continued)

(52) U.S. Cl.
 CPC ............ *C23C 14/562* (2013.01); *C23C 14/086* (2013.01); *C23C 14/14* (2013.01); *C23C 14/34* (2013.01);
 (Continued)

(58) Field of Classification Search
 CPC ...... C23C 14/545; C23C 14/562; C23C 14/56; G02F 1/1343; G02F 1/13439; G02F 1/133342
 See application file for complete search history.

(56) References Cited

U.S. PATENT DOCUMENTS 3,933,644 A 1/1976 Skinner et al.
4,489,124 A 12/1984 Watanabe
(Continued)

FOREIGN PATENT DOCUMENTS

CN 1349566 A 5/2002
CN 1732284 A 2/2006
(Continued)

OTHER PUBLICATIONS

Kim (Applied Physics A 72, 699-704 (2001)).*
(Continued)

*Primary Examiner* — Joel Horning
(74) *Attorney, Agent, or Firm* — Hauptman Ham, LLP (57) ABSTRACT

A method of continuously subjecting an elongated substrate to vacuum film formation is disclosed. The method comprises the steps of: feeding a first substrate from a first roll chamber in a first direction from the first roll chamber toward a second roll chamber; degassing the first substrate; forming a film of a second material on the first substrate, in a second film formation chamber; and rolling up the first substrate in the second roll chamber, thereby producing the first substrate, and comprises similar steps to produce a second substrate. In advance of producing the first substrate with the second material film, the first cathode electrode of the first film formation chamber is removed from the first film formation chamber, and, in advance of producing the second substrate with the first material film, the second cathode electrode of the second film formation chamber is removed from the second film formation chamber.

5 Claims, 4 Drawing Sheets (51) Int. Cl.
*C23C 14/14* (2006.01)
*C23C 14/34* (2006.01)
*H01L 21/67* (2006.01)

(52) U.S. Cl.
CPC ....... *C23C 14/568* (2013.01); *H01L 21/67132* (2013.01); *H01L 21/67173* (2013.01); *Y10T 428/31678* (2015.04)

(56) References Cited

U.S. PATENT DOCUMENTS

| | | | |
|---|---|---|---|
| 5,447,748 | A | 9/1995 | Kitaori et al. |
| 6,186,090 | B1 | 2/2001 | Dotter, II et al. |
| 6,463,874 | B1 | 10/2002 | Dotter, II et al. |
| 7,785,921 | B1 | 8/2010 | Juliano et al. |
| 8,076,174 | B2 | 12/2011 | Juliano et al. |
| 8,462,278 | B2 | 6/2013 | Nashiki et al. |
| 8,467,005 | B2 | 6/2013 | Nashiki et al. |
| 8,467,006 | B2 | 6/2013 | Nashiki et al. |
| 2005/0249875 | A1* | 11/2005 | Sasaki et al. ............... 427/248.1 |
| 2005/0274601 | A1* | 12/2005 | Moriwaki et al. ......... 204/192.2 |
| 2008/0176042 | A1* | 7/2008 | Nashiki et al. ............... 428/172 |
| 2009/0223551 | A1 | 9/2009 | Reddy et al. |
| 2010/0242842 | A1 | 9/2010 | Takeuchi et al. |
| 2010/0261008 | A1 | 10/2010 | Kikuchi |
| 2011/0019278 | A1 | 1/2011 | Aoki |
| 2011/0135892 | A1 | 6/2011 | Nashiki et al. |
| 2011/0141059 | A1 | 6/2011 | Nashiki et al. |
| 2011/0143105 | A1 | 6/2011 | Nashiki et al. |
| 2011/0147340 | A1 | 6/2011 | Nashiki et al. |
| 2011/0171395 | A1 | 7/2011 | Juliano et al. |

FOREIGN PATENT DOCUMENTS

| | | |
|---|---|---|
| CN | 101555589 A | 10/2009 |
| CN | 101696487 A * | 4/2010 |
| CN | 101982031 A | 2/2011 |
| DE | 10157186 | 1/2003 |
| EP | 0428358 | 5/1991 |
| EP | 1947551 A2 | 7/2008 |
| EP | 2216831 | 8/2010 |
| EP | 2268119 | 12/2010 |
| JP | 54021308 A | 2/1979 |
| JP | 57167137 A | 10/1982 |
| JP | 562294174 A | 12/1987 |
| JP | S62294174 A | 12/1987 |
| JP | 07-098854 | 4/1995 |
| JP | 2001073133 A | 3/2001 |
| JP | 2005320599 A | 11/2005 |
| JP | 2009076432 A | 4/2009 |
| JP | 4415584 | 2/2010 |
| JP | 2010-236076 | 10/2010 |
| WO | 2011013939 | 2/2011 |
| WO | 2011046050 A1 | 4/2011 |

OTHER PUBLICATIONS

European Search Report for 12165756 dated Jul. 18, 2012.
Japanese Office Action for application No. 2012-068801 dated Sep. 9, 2015.
Taiwanese Office Action for application No. 101115177 dated Aug. 5, 2015.
Huang, "Heat Treatment of Practical Chemistry and New Technology for Surface Reinforcement", China Machine Press, Jun. 30, 2002, 5 pages.
Chinese Office Action dated issued Feb. 29, 2016 in connection with the counterpart Chinese Patent Application No. 201210132151.3.
Chinese Office Action for application No. 201210132151.3 dated Jun. 17, 2015.
Chinese Office Action issued on Aug. 3, 2016 in connection with the counterpart Chinese Patent Application No. 201210132151.3.

* cited by examiner

VACUUM FILM FORMATION METHOD AND LAMINATE OBTAINED BY THE METHOD

CROSS REFERENCE TO RELATED APPLICATION

This application claims the priority of Japanese Patent Application No. 2011-100509 filed on Apr. 28, 2011, and Japanese Patent Application No. 2012-068801 filed on Mar. 26, 2012 in the JPO (Japan Patent Office), the disclosure of which is incorporated herein in their entirety by reference.

TECHNICAL FIELD

The present invention relates to a method for film formation, particularly to a method for continuously subjecting an elongated substrate to vacuum film formation, and a laminate obtained by the method.

BACKGROUND ART

As a film forming process, various processes, such as a vacuum vapor deposition process, a sputtering process and an ion plating process, have been developed. A laminate obtained by such a film formation process is widely utilized in production of display devices, such as liquid crystal displays or organic EL displays, semiconductor devices, etc. In the display devices, the semiconductor devices, etc., the laminate is usable as a protective film, and various types of functional films, such as an optical filter and an anti-reflection film.

Late years, demand for device units using the functional films, such as a LCD (Liquid Crystal Display) TV, a mobile phone and a video game machine, has been rapidly expanded. Along with expansion of the demand, it has become an urgent matter to develop a technique for mass-producing a functional film within a short period of time. In order to respond to this need, a roll-to-roll technique has been developed. The roll-to-roll technique is designed to feed an elongated substrate wound in a roll form, between two rolls, so as to enable continuous film formation, thereby enhancing efficiency of a film formation operation.

However, mass production based on the conventional unsophisticated roll-to-roll technique has limitations. Moreover, a layered structure required for a functional film is likely to vary depending on the type of device to which the functional film is applied, performance required for the functional film, etc. Thus, there is a need for developing a flexible film formation method capable of producing various laminate structures within a short period of time and in an easy and low-cost manner.

One example of a film formation method using a roll-to-roll technique is disclosed in JP 4415584B (Patent Document 1). In this film formation method, one rotary drum is provided between two rolls, and a plurality of targets are arranged with respect to the one rotary drum which is transporting a substrate, to enable continuous film formation, thereby enhancing efficiency of the film formation operation.

JP 2010-236076A (Patent Document 2) and JP 07-098854A (Patent Document 3) disclose a film formation method capable of subjecting both sides of a substrate to film formation, using a roll-to-roll technique. In this film formation method, to enable double-side film formation, two rotary drums and one take-up roll located between the rotary drums are used, wherein a roll fed from a feed roll is subjected to film formation through the two rotary drums which are rotating in respective opposite directions, and then rolled up on the take-up roll.

LIST OF PRIOR ART DOCUMENTS

PATENT DOCUMENTS

Patent Document 1: JP 4415584B
Patent Document 2: JP 2010-236076A
Patent Document 3: JP 07-098854A

SUMMARY OF THE INVENTION

Problem to be Solved by the Invention

However, in an apparatus implementing any one of the above conventional film formation methods, a target is fixed at a position spaced apart by a predetermined distance with respect to a rotary drum. Thus, in order to perform maintenance on the target supported by a cathode electrode, it is necessary to stop the film formation operation. This causes a problem of deterioration in efficiency of the film formation operation.

The film formation methods disclosed in the Patent Documents 2 and 3 are simply capable of forming a film on one side or both sides of a substrate at best, but incapable of producing a wide variety of laminate structures other than that. Thus, for producing various types of laminates, it is necessary to set up a different production line in each case, which leads to an increase of costs.

Moreover, the above conventional film formation methods are likely to fail to sufficiently perform heating, after completion of film formation. This causes a problem that a material of the formed film is likely to fail to be fully crystallized.

The present invention has been made to solve the above problems in the conventional techniques, and an object thereof is to provide a film formation method based on a roll-to-roll technique, enhanced in efficiency of a film formation operation, for example, by allowing a cathode electrode requiring maintenance to be removed from a film formation chamber, or to provide a film formation method enhanced in efficiency of a film formation operation or based on an improved roll-to-roll technique, for example, by providing a film formation method capable of simultaneously coping with two-layer film formation and double-side film formation.

Means for Solving the Problem

In order to achieve the above object, according to a first aspect of the present invention, there is provided a method for continuously subjecting an elongated substrate to vacuum film formation. The method comprises the steps of: (a) feeding an elongated substrate wound in a roll form, from a first roll chamber in a first direction from the first roll chamber toward a second roll chamber; (b) degassing the substrate fed in the first direction; (c) forming, in a second film formation chamber, a film of a second material on a surface of the degassed substrate; (d) rolling up, in the second roll chamber, the substrate having the second material film formed thereon; (e) feeding the substrate rolled up in the second roll chamber, from the second roll chamber in a second direction from the second roll chamber toward the first roll chamber; (f) forming, in a first film formation chamber, a film of a first material on the second material film formed on the surface of the substrate fed in the second direction; and (g) rolling up, in the first roll chamber, the substrate having the first material film laminated on the second material film. In the method according to the first aspect of the present invention, the second material film can be formed in the course of a first path for feeding the substrate from the first roll chamber to the second roll chamber, and the first material film can be formed in the course of a second path for feeding the substrate from the second roll chamber to the first roll chamber. Thus, the substrate can be fed back and forth between the first roll chamber and the second roll chamber to continuously produce, in a roll-to-roll manner, a laminate comprising the second material film and the first material film laminated on the substrate in this order.

In the above method, in a period after feeding from the first roll chamber and before formation of the second material film, the substrate may be subjected to a plasma treatment. Further, in a period after feeding from the second roll chamber and before formation of the first material film, the substrate may be subjected to a plasma treatment. This makes it possible to strengthen the effect of the plasma treatment.

In the above method, in a period after feeding from the first roll chamber and before formation of the second material film, the substrate may be subjected to degassing. Further, in a period after feeding from the second roll chamber and before formation of the first material film, the substrate may be subjected to degassing. This makes it possible to perform degassing before forming the second material film in the second film formation chamber.

In the above method, the substrate being guided in the first direction may be degassed in the first film formation chamber. Specifically, a first rotary member may have a heating function to heat the substrate to degas the substrate or remove volatile components in the film.

In the above method, in advance of forming, in the second film formation chamber, the second material film on the surface of the substrate fed in the first direction, a first cathode electrode for supporting a target of the first material in the first film formation chamber is removed from the first film formation chamber. Similarly, in advance of forming, in the first film formation chamber, the first material film on the second material film formed on the surface of the substrate fed in the second direction, a second cathode electrode for supporting a target of the second material in the second film formation chamber is removed from the second film formation chamber. In this case, maintenance on the target of the first material can be performed in the first film formation chamber, while continuously performing a film formation operation in the second film formation chamber, so that it becomes possible to increase production efficiency.

In the above method, in a period after formation of the second material film and before rolling up in the second roll chamber, the substrate may be subjected to annealing. This makes it possible to subject the second material film formed in the second film formation chamber to annealing.

In the above method, the first material may be a metal, and the second material may be a transparent electrically-conductive material.

In order to achieve the above object, according to a second aspect of the present invention, there is provided a method for continuously subjecting an elongated substrate to vacuum film formation. The method comprises the steps of: (a) feeding an elongated substrate wound in a roll form, from a first roll chamber in a first direction from the first roll chamber toward a second roll chamber; (b) degassing the substrate fed in the first direction; (c-1) in a first feed path, guiding the degassed substrate in the first direction and to a second film formation chamber, forming, in the second film formation chamber, a film of a second material on a first surface of the substrate which is being guided in the first direction, rolling up, in the second roll chamber, the substrate having the second material film formed thereon, feeding the substrate rolled up in the second roll chamber, from the second roll chamber in a second direction from the second roll chamber toward the first roll chamber, forming, in a first film formation chamber, a film of a first material on the second material film formed on the first surface of the substrate fed in the second direction, and rolling up, in the first roll chamber, the substrate having the first material film laminated on the second material film; and (c-2) in a second feed path, guiding the degassed substrate in the first direction and to the first film formation chamber, forming, in the first film formation chamber, a film of a third material on the first surface of the substrate which is being guided in the first direction, guiding the substrate having the third material film formed thereon, in the second direction and to the second film formation chamber, forming, in the second film formation chamber, a film of a fourth material on a second surface located on an opposite side of the first surface of the substrate which is being guided in the second direction, and rolling up, in a third roll chamber, the substrate having the third material film formed on the first surface and the fourth material film formed on the second surface. In the method according to the second aspect of the present invention, in the first feed path, the substrate can be fed back and forth between the first roll chamber and the second roll chamber to form the second material film on the first surface when the substrate is being guided in the first direction and form the first material film on the first surface when the substrate is being guided in the second direction. Thus, it becomes possible to continuously produce, in a roll-to-roll manner, a laminate comprising the second material film and the first material film laminated on the substrate in this order. On the other hand, in the second feed path, the third material film can be formed on the first surface when the substrate is being guided in the first direction, and the fourth material film can be formed on the second surface when the substrate is being guided in the second direction. Thus, it become possible to continuously produce, in a roll-to-roll manner, a laminate comprising having the third material film and the fourth material film formed on respective ones of the first and second surfaces of the substrate.

In the above method, in a period after feeding from the first roll chamber and before formation of the second material film, in the first feed path, the substrate may be subjected to a plasma treatment. The plasma treatment makes it possible to activate and clean a surface of the substrate before the second material film is formed thereon.

In the above method, in a period after feeding from the first roll chamber and before rolling up in the second roll chamber, in the first feed path, the substrate may be subjected to annealing. This makes it possible to subject the second material film formed in the second film formation chamber to annealing.

In the above method, in advance of forming, in the first feed path and in the second film formation chamber, the second material film on the first surface of the substrate fed in the first direction, a first cathode electrode for supporting a target of the first material in the first film formation chamber is removed from the first film formation chamber. Further, in advance of forming, in the first feed path and in the first film formation chamber, the first material film on the first surface of the substrate fed in the second direction, a second cathode electrode for supporting a target of the second material in the second film formation chamber is removed from the second film formation chamber. In this case, maintenance on the cathode electrode can be performed in the first film formation chamber, while continuously performing a film formation operation in the second film formation chamber, so that it becomes possible to increase production efficiency.

In the above method, the first material may be a metal, and the second material may be a transparent electrically-conductive material, wherein the metal may be copper, copper alloy, silver or silver alloy.

In the above method, the third material may be a transparent electrically-conductive material, and the fourth material may be a transparent electrically-conductive material.

Effect of the Invention

The present invention makes it possible to enhance efficiency of the film formation operation using a roll-to-roll technique, or improve the roll-to-roll technique.

DESCRIPTION OF EMBODIMENTS

With reference to the accompanying drawings, a preferred embodiment of the present invention will now be described.

Figure 1:
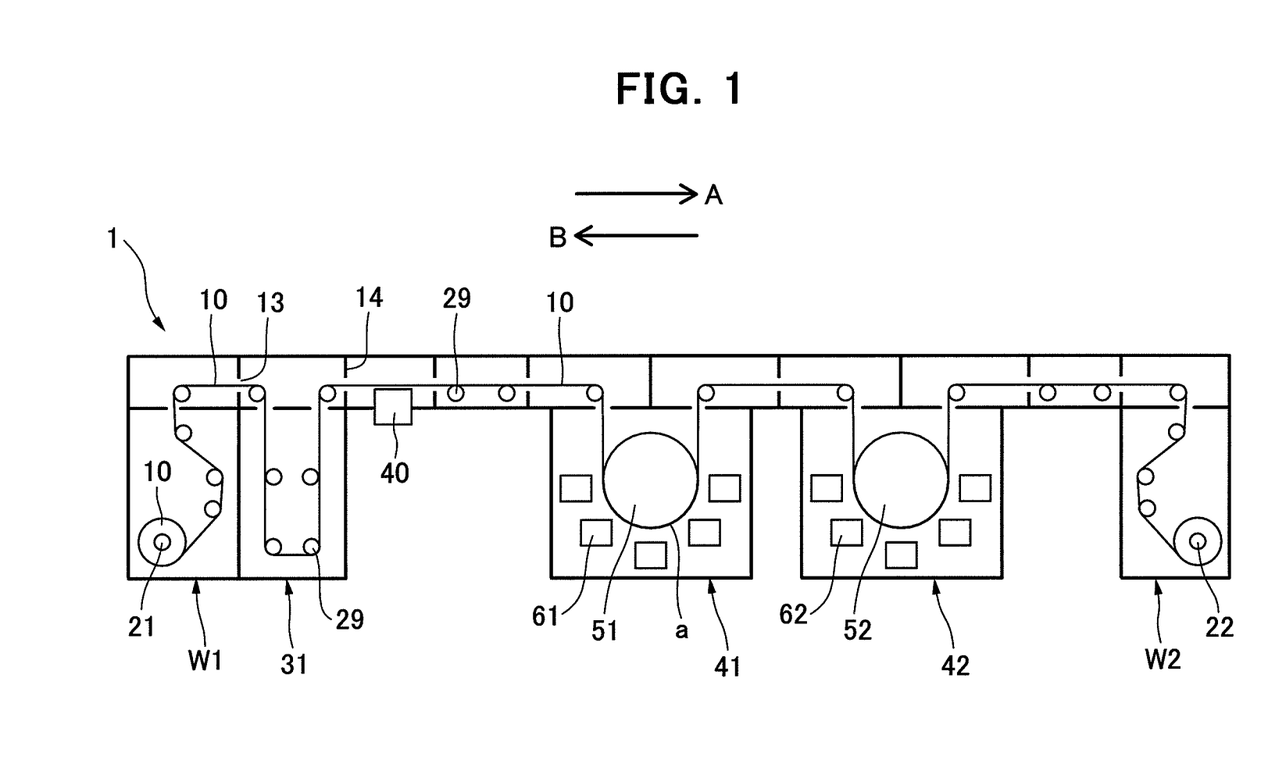
FIG. 1 is a schematic diagram illustrating one example of a film formation apparatus capable of implementing a film formation method according to the present invention.

FIG. 1 illustrates one example of a film formation apparatus 1 capable of implementing a first film formation method according to the present invention. For example, the film formation apparatus 1 comprises: a first roll chamber W1 and a second roll chamber W2 each capable of housing an elongated substrate 10 wound in a roll form; a first film formation chamber 41 and a second film formation chamber 42 each provided between the first roll chamber W1 and the second roll chamber W2; a heating chamber 31 provided between the first roll chamber W1 and the first film formation chamber 41; and a plasma treatment device 40 provided between the first heating chamber 31 and the first film formation chamber 41.

As a vacuum film formation process, there have been known a vacuum vapor deposition process, a sputtering process, a chemical vapor deposition (CVD) process, etc. The film formation apparatus 1 is adaptable to any one of the above processes. Among them, the sputtering process is capable of achieving a uniform sputtering over a large area and forming a dense thin film, with high continuous productivity and excellent production stability. In the sputtering process, particularly, DC Magnetron Sputtering is capable of forming a magnetic field on a surface of a target to confine electrons near the target so as to suppress damage to a substrate.

In order to effectively maintain a vacuum state, a partition 14 is provided between adjacent ones of the chambers of the film formation apparatus 1. Each of the partitions 14 is provided with a slit 13 for allowing the substrate 10 to pass therethrough.

The substrate 10 to be used in this method may be made of a material allowing a film to be formed thereon, such as one of a wide variety of resin films including a PET film, or one of a wide variety of metal films including an aluminum sheet. The material of the substrate is not particularly limited. However, the substrate 10 is formed as a member having a generally elongated shape, and flexibility enough to be wound into a roll form. During film formation, the substrate 10 is fed using an array of guide rollers 29 and others, in a roll-to-roll manner, i.e., between the first roll chamber W1 and the second roll chamber W2, or, in some cases, between the first or second roll chamber and other roll chamber, in a first direction A from the first roll chamber W1 toward the second roll chamber W2, or in a second direction B from the second roll chamber W2 toward the first roll chamber W1.

In order to wind the substrate 10 into a roll form, a first feed/take-up roll 21, and a second feed/take-up roll 22 are provided in the first roll chamber W1 and the second roll chamber W2, respectively. When the substrate 10 is fed in the first direction A, the first feed/take-up roll 21 performs a feeding (feed-out) operation, and the second feed/take-up roll 22 performs a rolling-up (take-up) operation. On the other hand, when the substrate 10 is fed in the second direction B, the second feed/take-up roll 22 performs a feeding operation, and the first feed/take-up roll 21 performs a rolling-up (take-up) operation.

The heating chamber 31 is used to heat the substrate 10. An installation position of the heating chamber is not particularly limited. However, an obtainable effect varies depending on the installation position and a usage mode of the film formation apparatus 1, as described later.

For example, when the heating chamber 31 is provided between the first roll chamber W1 and the first film formation chamber 41 as illustrated in FIG. 1, the substrate 10 is heated by the heating chamber 31 before film formation in the first film formation chamber 41. During a vacuum process or the like, water is likely to come up to a surface from an inside of the substrate 10. In this case, such water has a great impact on a composition of a film to be formed. In the film formation apparatus 1, the heating chamber 31 is provided at the above position to subject the substrate 10 to degassing before film formation, so that it becomes possible to remove water from the substrate 10 to reduce the negative impact.

Additionally, a heating chamber may be provided between the second film formation chamber 42 and the second roll chamber W2, although not particularly illustrated. The heating chamber provided at the above position makes it possible to heat the substrate 10 after subjecting the substrate 10 to film formation in the second film formation chamber 42, thereby annealing a material of a film formed on the substrate 10 to change the atomic arrangement of the film such that crystal grains are regularly arranged.

Further, a heating chamber may be provided, for example, between the first film formation chamber 41 and the second film formation chamber 42, if needed. However, the heating chamber is not necessarily required. For example, a heating function of the film formation chamber may be utilized to obtain the same effect without providing the heating chamber.

The plasma treatment device 40 is used to subject the substrate 10 to a plasma treatment. The plasma treatment allows a surface of the substrate 10 to be activated and cleaned, thereby allowing film formation to be more effectively performed. As with the heating chamber, an installation position of the plasma treatment device is not particularly limited.

For example, in the example illustrated in FIG. 1, the plasma treatment device 40 is provided between the first heating chamber 31 and the first film formation chamber 41. The plasma treatment device provided at the above position makes it possible to subject the substrate 10 to the plasma treatment before film formation in the first film formation chamber 41. Additionally, a heating chamber may be provided, for example, between the first film formation chamber 41 and the second film formation chamber 42, if needed. However, the plasma treatment device is not necessarily required. Further, the plasma treatment device may be omitted by utilizing a heating function of an aftermentioned rotary drum of the film formation chamber.

The film formation apparatus 1 has at least two film formation chambers (in this example, the first film formation chamber 41 and the second film formation chamber 42) between the first roll chamber W1 and the second roll chamber W2. Although it is only necessary to provide at least two film formation chambers, an additional film formation chamber may be provided. An installation position of the additional film formation chamber is not particularly limited as long as it is located between the first roll chamber W1 and the second roll chamber W2. For example, the additional film formation chamber may be provided between the heating chamber 31 and the first film formation chamber 41. A material of a film to be formed in each of the film forming chambers is not particularly limited. For example, it may be a metal such as copper, copper alloy, silver or silver alloy, or a transparent electrically-conductive film. The silver alloy may be a so-called APC (Ag—Pd—Cu) alloy prepared by adding palladium (Pd) and copper (Cu) to silver (Ag). In this case, silver may be contained in an amount of 90 atomic % as a primary component of the APC alloy.

The first film formation chamber 41 comprises a first rotary drum 51 and a first cathode electrode 61. The first rotary drum 51 is adapted to be bi-directionally rotatable to feed the substrate 10 in a selected one of the first direction A and the second direction B, so that the substrate 10 is fed in the selected one of the first direction A and the second direction B via a periphery of the first rotary drum 51. The first rotary drum 51 may have a function of heating the substrate 10. An effect to be obtained by the heating function of the first rotary drum 51 may be considered to be equal to that of the heating chamber. Therefore, the first rotary drum 51 may be used as a substitute for the heating function of the heating chamber. Conversely, the heating function of the heating chamber may be substituted for the heating function of the first rotary drum 51.

The first cathode electrode 61 consists of a plurality of electrode elements provided with respect to the first rotary drum 51. More specifically, each of the electrode elements of the first cathode electrode 61 is adapted to be movably located in opposed relation to the first rotary drum 51, while supporting a target for forming a film of a predetermined material. The predetermined material to be formed as a film may be freely changed depending on a usage mode of the film formation apparatus 1. For example, when the substrate 10 is passed around the first rotary drum 51 in the first direction, the predetermined material may be set to a first material or a third material. The first material and the third material may be freely changed depending on the usage mode of the film formation apparatus 1. During a period of time in which the substrate 10 is passed around the first rotary drum 51, a film of the predetermined material such as the first or third material will be formed on the substrate 10 using the first cathode electrode 61.

The second film formation chamber 42 has the same or similar configuration and functions as/to those of the first film formation chamber 41, and comprises a second rotary drum 52 and a second cathode electrode 62. The second rotary drum 52 is adapted to continuously feed the substrate 10 in a selected one of the first direction A and the second direction B via a periphery thereof, while heating the substrate 10. The second cathode electrode 62 consists of a plurality of electrode elements adapted to be movably disposed around and in opposed relation to the second rotary drum 52. For example, a predetermined material of a target to be supported by the second cathode electrode 62 may be set to a second material when the substrate 10 is passed around the second rotary drum 52 in the first direction, and may be set to a fourth material when the substrate 10 is passed around the second rotary drum 52 in the second direction. The second material and the fourth material may be freely changed depending on the usage mode of the film formation apparatus 1. During a period of time in which the substrate 10 is passed around the second rotary drum 52, a film of the predetermined material will be formed on the substrate 10 using the second cathode electrode 62.

A function of the heating in each of the first and second rotary drums 51, 52 and a function of the film formation are independent of each other. Thus, for example, the film formation apparatus 1 can be controlled such that the first film formation chamber 41 performs only the heating, and the second film formation chamber 42 performs only the film formation. With a view to allowing the heating to be sufficiently performed, each of the first and second rotary drums 51, 52 may be configured to have a relatively large diameter and thereby increase time to convey the substrate 10.

Figure 2:
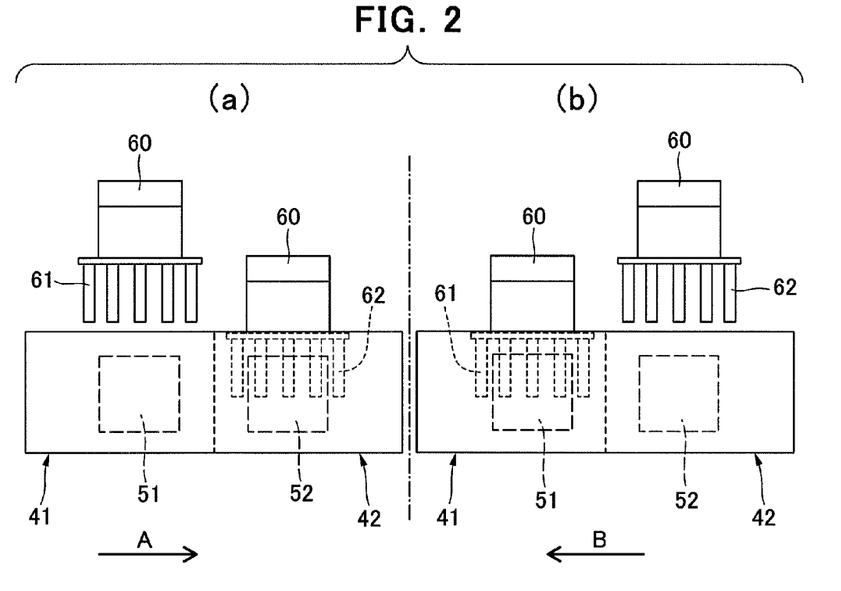
FIGS. 2(a) and 2(b) are schematic diagrams illustrating an arrangement of a cathode electrode achievable by the film formation method according to the present invention.

With reference to FIGS. 2(*a*) and 2(*b*) together with FIG. 1, a first usage mode of the first film formation method according to the present invention, using the film formation apparatus 1, will be described below. FIGS. 2(*a*) and 2(*b*) are schematic diagrams illustrating an arrangement of the cathode electrode achievable in the first usage mode. In the first usage mode, a substrate having a film of a second material formed thereon can be produced when it is fed in the first direction A from the first roll chamber W1 toward the second roll chamber W2 (in the first usage mode, the substrate being fed in the first direction A will be referred to as "first substrate", for the sake of simplicity), and a substrate having a film of a first material formed thereon can be produced when it is fed in the second direction B from the second roll chamber W2 toward the first roll chamber W1 (in the first usage mode, the substrate being fed in the second direction A will be referred to as "second substrate", for convenience sake).

As illustrated in FIG. 1, firstly, a first substrate is fed from the first roll chamber W1 in the first direction A. The fed first substrate is degassed using the heating functions of the first heating chamber 31 and the first rotary drum 51 of the first film formation chamber 41. Subsequently, a film of a second material (second material film) is formed on the degassed first substrate, using the second cathode electrode 62 of the second film formation chamber 42, and then the first substrate with the second material film is rolled up in the second roll chamber W2. Subsequently, a second substrate different from the first substrate is fed from the second roll chamber W2 in the second direction B. The fed second substrate is degassed in the second film formation chamber 42. Subsequently, a film of a first material (first material film) is formed on the degassed second substrate, using the first cathode electrode 61 of the first film formation chamber 41, and then the second substrate with the first material film is rolled up in the first roll chamber W1.

FIG. 2(*a*) is a schematic plan view illustrating respective arrangements of the first cathode electrode 61 of the first film formation chamber 41 and the second cathode electrode 62 of the second film formation chamber 42, to be achieved when a film is formed on the first substrate being fed in the first direction A, and FIG. 2(*b*) is a schematic plan view illustrating respective arrangements of the first cathode electrode 61 of the first film formation chamber 41 and the second cathode electrode 62 of the second film formation chamber 42, to be achieved when a film is formed on the second substrate being fed in the second direction B.

In the first usage mode, for example, when the first substrate having the second material film formed thereon (second material film-formed first substrate) is produced, all that is necessary for the first film formation chamber 41 is that the first rotary drum 51 of the first film formation chamber 41 can perform heating (degassing), but it is not necessary to perform film formation using the first cathode electrode 61. Thus, the degassing or the like in the first film formation chamber 41 may be performed under a condition that the first cathode electrode 61 is removed from the first film formation chamber 41, for example, by moving an electrode body 60 supporting the first cathode electrode 61, as illustrated in FIG. 2(*a*). As a result, the first cathode electrode 61 removed from the first film formation chamber 41 can be subjected to maintenance such as replacement, and the film formation in the second film formation chamber 42 can be continuously performed even during the maintenance. An opening of the first film formation chamber 41 for allowing the first cathode electrode 61 to be removed from the first film formation chamber 41 therethrough may be closed by a temporary cover or the like, if necessary.

Similarly, in the first usage mode, for example, when the second substrate having the first material film formed thereon (first material film-formed second substrate) is produced, all that is necessary for the second film formation chamber 42 is that the second rotary drum 52 of the second film formation chamber 42 can perform heating (degassing), but it is not necessary to perform film formation using the second cathode electrode 62. Thus, the degassing or the like in the second film formation chamber 42 may be performed under a condition that the second cathode electrode 62 is removed from the second film formation chamber 42, as illustrated in FIG. 2(*b*). As a result, the second cathode electrode 62 removed from the second film formation chamber 42 can be subjected to maintenance such as replacement, and the film formation in the first film formation chamber 41 can be continuously performed even during the maintenance. An opening of the second film formation chamber 42 for allowing the second cathode electrode 62 to be removed from the second film formation chamber 42 therethrough may be closed by a temporary cover or the like, in the same manner as described above, if necessary.

As above, in the first usage mode of the first film formation method, in one of the first and second film formation chambers 41, 42, maintenance on a corresponding one of the first and second cathode electrodes 61, 62 can be performed, while continuously performing a film formation operation in a remaining one of the first and second film formation chambers 41, 42, so that it becomes possible to increase production efficiency.

In the first usage mode, in a period after feeding from the first roll chamber W1 and before formation of the second material film in the second film formation chamber 42, the first substrate can be subjected to a plasma treatment, using, for example, the plasma treatment device 40 provided between the heating chamber 31 and the first film formation chamber 41, and/or a plasma treatment device (not illustrated) provided between the first film formation chamber 41 and the second film formation chamber 42. Further, in a period after feeding from the second roll chamber W2 and before formation of the first material film in the first film formation chamber 41, the second substrate can be subjected to a plasma treatment, using, for example, a plasma treatment device (not illustrated) provided between the second roll chamber W2 and the second film formation chamber 42, and/or a plasma treatment device (not illustrated) provided between the second film formation chamber 42 and the first film formation chamber 41. The plasma treatment makes it possible to effective perform the film formation.

In the first usage mode, in a period after feeding from the first roll chamber W1 and before degassing by the heating function (of the first rotary drum 51) in the first film formation chamber 41, the first substrate can be subjected to degassing, using, for example, the heating chamber 31 provided between the first roll chamber W1 and the first film formation chamber 41. Further, in a period after feeding from the second roll chamber W2 and before degassing by the heating function (of the second rotary drum 52) in the second film formation chamber 42, the second substrate can be subjected to degassing, using, for example, a heating chamber (not illustrated) provided between the second roll chamber W2 and the second film formation chamber 42.

In the first usage mode, in a period after formation of the first material film and before rolling up in the first roll chamber W1, the second substrate can be subjected to annealing, using, for example, the heating chamber 31 provided between the first film formation chamber 41 and the first roll chamber W1. Further, in a period after formation of the second material film and before rolling up in the second roll chamber W2, the first substrate can be subjected to annealing, using, for example, a heating chamber (not illustrated) provided between the second film formation chamber 42 and the second roll chamber W2.

Referring to FIG. 1 again, a second usage mode of the first film formation method according to the present invention, using the film formation apparatus 1, will be described below.

In the second usage mode, firstly, in the course of a first path for feeding a substrate 10 from the first roll chamber W1 to the second roll chamber W2, the substrate 10 is fed from the first roll chamber W1 in the first direction A, and the fed substrate 10 is degassed using the heating functions of the first heating chamber 31 and the first rotary drum 51 of the first film formation chamber 41. Subsequently, a second material film is formed on a surface of the degassed substrate 10, using the second cathode electrode 62 of the second film formation chamber 42, and then the first substrate having the second material film formed thereon is rolled up once in the second roll chamber W2. Subsequently, in the course of a return or second path for feeding a substrate 10 from the second roll chamber W2 to the first roll chamber W1, the substrate 10 is fed from the second roll chamber W2 in the second direction B, and a first material film is formed on the fed substrate 10, using the first cathode electrode 61 of the first film formation chamber 41. Finally, the substrate 10 having the first material film laminated on the second material film is rolled up in the first roll chamber W1.

Figure 3:
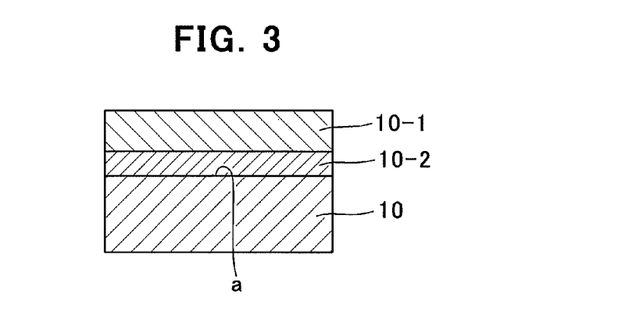
FIG. 3 is a schematic diagram illustrating one example of a structure of a laminate produced by the film formation method according to the present invention.

Obviously, in the second usage mode, the substrate 10 can be fed back and forth between the first roll chamber W1 and the second roll chamber W2 to continuously produce, in a roll-to-roll manner, a laminate comprising the second material film and the first material film laminated on the substrate in this order. FIG. 3 illustrates one example of a structure of the laminate produced by the second use mode. The laminate has a second material film 10-2 and a first material film 10-1 laminated on a substrate 10 in this order. For example, the first material film 10-1 may be made of a metal, such as copper (Cu), copper alloy, silver (Ag) or silver alloy (e.g., APC alloy), and the second material film 10-2 may be made of a transparent electrically-conductive film, such as non-crystalline or crystalline ITO. However, the first and second materials are not particularly limited.

In the second usage mode, in a period after feeding from the first roll chamber W1 and before formation of the second material film in the second film formation chamber 42, the substrate 10 can be subjected to a plasma treatment, using, for example, the plasma treatment device 40 provided between the heating chamber 31 and the first film formation chamber 41, and/or a plasma treatment device (not illustrated) provided between the first film formation chamber 41 and the second film formation chamber 42. Further, in a period after feeding from the second roll chamber W2 and before formation of the first material film in the first film formation chamber 41, the substrate 10 can be subjected to a plasma treatment, using, for example, a plasma treatment device (not illustrated) provided between the second roll chamber W2 and the second film formation chamber 42, and/or a plasma treatment device (not illustrated) provided between the second film formation chamber 42 and the first film formation chamber 41.

In the second usage mode, in a period after feeding from the first roll chamber W1 and before formation of the second material film in the second film formation chamber 42, the substrate 10 can be subjected to degassing, using, for example, the heating chamber 31 provided between the first roll chamber W1 and the first film formation chamber 41, a heating chamber (not illustrated) provided between the first film formation chamber 41 and the second film formation chamber 42, and/or the heating function of the first rotary drum 51 of the first film formation chamber 41. Further, in a period after feeding from the second roll chamber W2 and before formation of the first material film in the first film formation chamber 41, the substrate 10 can be subjected to degassing, using, for example, a heating chamber (not illustrated) provided between the second roll chamber W2 and the second film formation chamber 42, a heating chamber (not illustrated) provided between the second film formation chamber 42 and the first film formation chamber 41, and/or the heating function of the second rotary drum 52 of the second film formation chamber 42.

In the second usage mode, in a period after formation of the second material film in the second film formation chamber 42 and before rolling up in the second roll chamber W2, the substrate 10 can be subjected to annealing, using, for example, a heating chamber (not illustrated) provided between the second film formation chamber 42 and the second roll chamber W2.

As with the first usage mode, in the second usage mode, for example, when the second material film is formed in the first path, it is not necessary to perform film formation in the first film formation chamber 41, using the first cathode electrode 61. Thus, the degassing or the like in the first film formation chamber 41 may be performed under a condition that the first cathode electrode 61 is removed from the first film formation chamber 41. As a result, the first cathode electrode 61 removed from the first film formation chamber 41 can be subjected to maintenance such as replacement, and the film formation in the second film formation chamber 42 can be continuously performed even during the maintenance.

Similarly, in the second usage mode, for example, when the first material film is formed on the second material film, it is not necessary to perform film formation in the second film formation chamber 42, using the second cathode electrode 62. Thus, the degassing or the like in the second film formation chamber 42 may be performed under a condition that the second cathode electrode 62 is removed from the second film formation chamber 42. As a result, the second cathode electrode 62 removed from the second film formation chamber 42 can be subjected to maintenance such as replacement, and the film formation in the first film formation chamber 41 can be continuously performed even during the maintenance.

Figure 4:
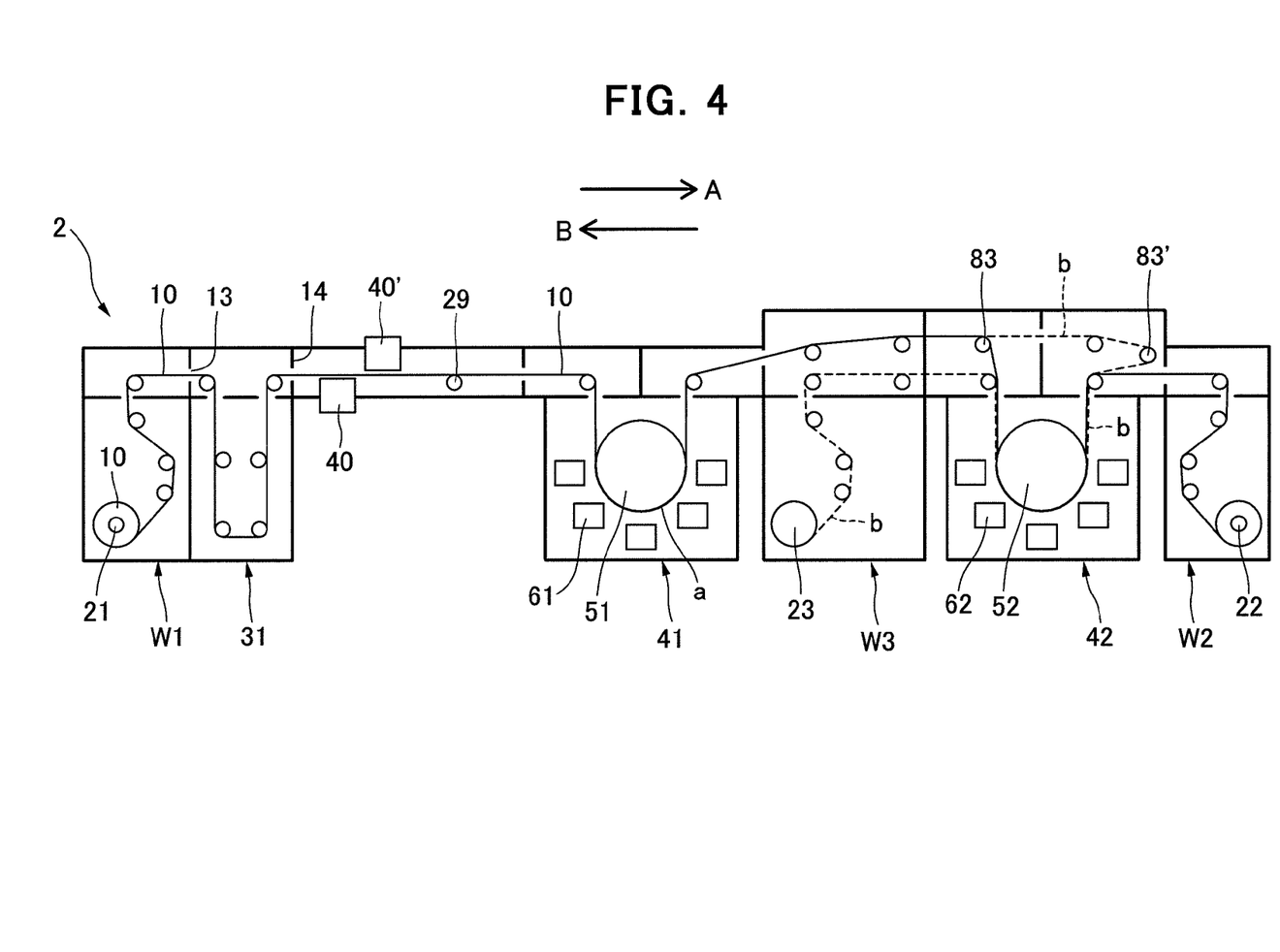
FIG. 4 is a schematic diagram illustrating one example of another film formation apparatus capable of implementing a film formation method according to the present invention.

FIG. 4 illustrates an example of a configuration of a film formation apparatus 2 capable of implementing a second film formation method according to the present invention. In FIG. 4, the same element or component as that in the film formation apparatus 1 illustrated in FIG. 1 is assigned with the same reference numeral or code as that in FIG. 1. Although the film formation apparatus 2 is primarily designed to implement the second film formation method, it is capable of implementing the first film formation method as well as the second film formation method, as is evidenced from the following description.

Although the film formation apparatus 2 has a similar configuration to that of the film formation apparatus 1 illustrated in FIG. 1, the film formation apparatus 2 has a third roll chamber W3, switching rolls 83, 83', and two types of guide roller arrays formable using the switching rolls 83, 83', in addition to the configuration of the film formation apparatus 1. In the second film formation method, a substrate feed path based on a guide roll array incorporating the switching rolls 83, and a substrate feed path based on a guide roll array incorporating the switching rolls 83', will be referred to respectively as "first feed path" and "second feed path", for the sake of simplicity.

In a period after a substrate 10 is fed from the first roll chamber W1 through until it reaches the switching roll 83, the substrate 10 is moved along a common part between a first feed path and a second feed path. After reaching the switching roll 83, in the first feed path, the substrate 10 is fed to pass through the second film formation chamber 42 in the first direction A, as indicated by the solid line, whereas, in the second feed path, the substrate 10 is turned around by the switching roll 83' and thereby fed to pass through the second film formation chamber 42 in the second direction B, as indicated by the broken line.

The second film formation method will be more specifically described below. Firstly, the substrate 10 is fed from the first roll chamber W1 in the first direction A, and then degassed using the heating functions of the first heating chamber 31 and the first rotary drum 51 of the first film formation chamber 41. The degassed substrate 10 is moved along the first feed path or the second feed path using the switching rolls 83, 83'.

In the first feed path, the degassed substrate 10 is guided in the first direction A to the second film formation chamber 42, and a second material film is formed on a first surface of the substrate 10 being guided, by using the second cathode electrode 62 of the second film formation chamber 42. Then, the substrate 10 having the second material film formed thereon is rolled up once in the second roll chamber W2. Subsequently, the same substrate 10 is fed from the second roll chamber W2 in the second direction B, and a first material film is formed on the first surface of the fed substrate 10, using the first cathode electrode 61 of the first film formation chamber 41. Finally, the substrate 10 having the first material film laminated on the second material film is rolled up in the first roll chamber W1. As above, the first feed path is designed to move the substrate 10 in the same manner as the aforementioned second usage mode. Thus, the substrate 10 can be fed back and forth between the first roll chamber W1 and the second roll chamber W2 to form the second material film on the first surface when the substrate 10 is being guided in the first direction A, and form the first material film on the first surface when the substrate 10 is being guided in the second direction B to continuously produce, in a roll-to-roll manner, a laminate comprising the second material film and the first material film laminated on the substrate in this order.

On the other hand, in the second feed path, a third material film is formed on the first surface a of the substrate 10 degassed in the first heating chamber 31 or being degassed using the first rotary drum 51 of the first film formation chamber 41, by using the first cathode electrode 61 of the first film formation chamber 41. Then, the substrate 10 having the third material film formed thereon is guided in the second direction B to the second film formation chamber 42, using the switching roll 83', and a fourth material film is formed on a second surface b located on an opposite side of the first surface a of the substrate 10 which is being guided in the second direction B, by using the second cathode electrode 62 of the second film formation chamber 42. Then, the substrate 10 is rolled up in the third roll chamber W. As above, in the second feed path, the third material film can be formed on the first surface when the substrate is being guided in the first direction, and the fourth material film can be formed on the second surface when the substrate is being guided in the second direction. Thus, it become possible to continuously produce, in a roll-to-roll manner, a laminate comprising having the third and fourth material films formed on respective ones of the opposite surfaces of the substrate.

Obviously, the laminate obtained through the first feed path is the same as the laminate in FIG. 3. As with the laminate in FIG. 3, for example, the first material film may be made of a metal, such as copper (Cu), copper alloy, silver (Ag) or silver alloy (e.g., APC alloy), and the second material film may be made of a transparent electrically-conductive film, such as non-crystalline or crystalline ITO. However, the first and second materials are not particularly limited.

Figure 5:
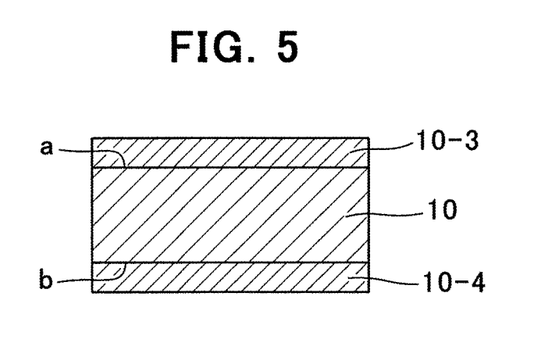
FIG. 5 is a schematic diagram illustrating another example of the structure of the laminate produced by the film formation method according to the present invention.

FIG. 5 illustrates one example of a structure of the laminate obtained through the second feed path. A third material film 10-3 and a fourth material film 10-4 are formed, respectively, on the first surface a and the second surface b of the substrate 10. For example, each of the third material film 10-3 and the fourth material film 10-4 as illustrated in FIG. 5 may be made of a transparent electrically-conductive film, such as non-crystalline or crystalline ITO. However, the third and fourth materials are not particularly limited.

In the second film formation method, for example, in a period after feeding from the first roll chamber W1 and before formation of the second material film, the substrate 10 can be subjected to a plasma treatment, using, for example, the plasma treatment device 40 provided between the heating chamber 31 and the first film formation chamber 41, and/or a plasma treatment device (not illustrated) provided between the first film formation chamber 41 and the third roll chamber W3 or between the third roll chamber W3 and the second film formation chamber 42.

In the second film formation method, in a period after feeding from the first roll chamber W1 and before rolling up in the second roll chamber W2, the substrate 10 can be subjected to annealing, using, for example, a heating chamber (not illustrated) provided between the second film formation chamber 42 and the second roll chamber W2.

As with the first film formation method, in the second film formation method, for example, when the second material film is formed in the second film formation chamber 42 in the first feed path, it is not necessary to perform film formation in the first film formation chamber 41, using the first cathode electrode 61. Thus, the degassing or the like in the first film formation chamber 41 may be performed under a condition that the first cathode electrode 61 is removed from the first film formation chamber 41. As a result, the first cathode electrode 61 removed from the first film formation chamber 41 can be subjected to maintenance such as replacement, and the film formation in the second film formation chamber 42 can be continuously performed even during the maintenance.

Similarly, in the second film formation method, for example, for example, when the second material film is formed in the second film formation chamber 42 in the first feed path, it is not necessary to perform film formation in the second film formation chamber 42, using the second cathode electrode 62. Thus, the degassing or the like in the second film formation chamber 42 may be performed under a condition that the second cathode electrode 62 is removed from the second film formation chamber 42. As a result, the second cathode electrode 62 removed from the second film formation chamber 42 can be subjected to maintenance such as replacement, and the film formation in the first film formation chamber 41 can be continuously performed even during the maintenance.

The above description has been made based on an example where only two film formation chambers are provided. However, it is to be understood that a film formation apparatus comprising three or more film formation chambers can obtain the same effects. Further, as described in connection with the configurations of the first and second film formation apparatuses, a heating chamber or a plasma treatment device may be appropriately provided at an adequate position, and the film formation method of the present invention may be implemented in a film formation apparatus incorporating it.

As above, the present invention includes various changes and modifications encompassed within a technical scope thereof.

INDUSTRIAL APPLICABILITY

The method of the present invention can be widely used in various types of film formation apparatuses.

EXPLANATION OF CODES

1: film formation apparatus
2: film formation apparatus
10: substrate
29: guide roll
31: heating chamber
40: plasma treatment device
41: first film formation chamber
42: second film formation chamber
51: first rotary drum
52: second rotary drum
83: switching roll
W1: first roll chamber
W2: second roll chamber
W3: third roll chamber

What is claimed is:

1. A method for continuously subjecting an elongated substrate to vacuum film formation, comprising the steps of:
    (a) feeding an elongated substrate wound in a roll form, from a first roll chamber in a first direction from the first roll chamber toward a second roll chamber;
    (b) degassing the substrate fed in the first direction, wherein a first cathode electrode for supporting a target of a first material in a first film formation chamber is removed from the first film formation chamber prior to degassing the substrate;
    (c) forming, in a second film formation chamber, a film of a second material on a surface of the degassed substrate, wherein the first cathode electrode remains removed from the first film formation chamber during forming the film of the second material on the surface of the degassed substrate;
    (d) rolling up, in the second roll chamber, the substrate having the second material film formed thereon;
    (e) feeding the substrate rolled up in the second roll chamber, from the second roll chamber in a second direction from the second roll chamber toward the first roll chamber, wherein a second cathode electrode for supporting a target of the second material in the second film formation chamber is removed, and the first cathode electrode for supporting the target of the first material is inserted in the first film formation chamber;
    (f) forming, in the first film formation chamber, a film of the first material on the second material film formed on the surface of the substrate fed in the second direction, wherein the second cathode electrode remains removed from the second film formation chamber during forming the film of the first material on the second material film; and
    (g) rolling up, in the first roll chamber, the substrate having the first material film laminated on the second material film.

2. The method as defined in claim 1, wherein the substrate being guided in the first direction is degassed in the first film formation chamber.

3. The method as defined in claim 1, wherein the first material is a metal, and the second material is a transparent electrically-conductive material.

4. The method as defined in claim 1, further comprising performing a plasma treatment on the substrate.

5. The method as defined in claim 4, wherein the plasma treatment is performed prior to forming the film of the second material.

* * * * *